United States Patent

Bassi et al.

(10) Patent No.: US 10,855,296 B2
(45) Date of Patent: Dec. 1, 2020

(54) CALIBRATING AN INJECTION LOCKED OSCILLATOR

(71) Applicant: Infineon Technologies AG, Neubiberg (DE)

(72) Inventors: Matteo Bassi, Villach (AT); Giovanni Boi, Villach (AT); Dmytro Cherniak, Villach (AT); Fabio Padovan, Villach (AT)

(73) Assignee: Infineon Technologies AG

( * ) Notice: Subject to any disclaimer, the term of this patent is extended or adjusted under 35 U.S.C. 154(b) by 0 days.

(21) Appl. No.: 16/585,689

(22) Filed: Sep. 27, 2019

(65) Prior Publication Data

US 2020/0106387 A1 Apr. 2, 2020

(30) Foreign Application Priority Data

Sep. 27, 2018 (DE) .................. 10 2018 216 614

(51) Int. Cl.
| | |
|---|---|
| *H03L 7/24* | (2006.01) |
| *H03L 7/18* | (2006.01) |
| *H03L 7/099* | (2006.01) |
| *H03G 5/14* | (2006.01) |
| *H03J 5/24* | (2006.01) |
| *H03B 5/12* | (2006.01) |

(52) U.S. Cl.
CPC .............. *H03L 7/24* (2013.01); *H03B 5/1215* (2013.01); *H03B 5/1228* (2013.01); *H03B 5/1265* (2013.01); *H03G 5/14* (2013.01); *H03J 5/246* (2013.01); *H03L 7/099* (2013.01); *H03L 7/18* (2013.01); *H03B 2200/0074* (2013.01); *H03J 2200/10* (2013.01)

(58) Field of Classification Search
CPC .......... H03B 2200/0074; H03B 5/1215; H03B 5/1265; H03B 5/1228; H03B 19/00; H03B 19/14; H03L 7/24
See application file for complete search history.

(56) References Cited

U.S. PATENT DOCUMENTS

| | | | | |
|---|---|---|---|---|
| 6,963,249 | B2 * | 11/2005 | Devries | ..................... H03L 7/24 331/117 FE |
| 8,384,485 | B2 * | 2/2013 | Fortier | .................... H03L 7/099 327/156 |
| 2014/0266454 | A1 | 9/2014 | Testi et al. | |
| 2015/0326230 | A1 | 11/2015 | Xu et al. | |
| 2019/0319581 | A1 * | 10/2019 | Chen | .................... H03L 7/0891 |

FOREIGN PATENT DOCUMENTS

| | | | | |
|---|---|---|---|---|
| WO | WO-2014106899 A1 * | 7/2014 | ............. | H03L 7/183 |
| WO | 2015042814 A1 | 4/2015 | | |

* cited by examiner

*Primary Examiner* — Ryan Johnson
(74) *Attorney, Agent, or Firm* — Design IP

(57) ABSTRACT

A circuit for calibrating an injection locked oscillator is provided. The injection locked oscillator includes an injection locking input, an LC tank and an oscillator output to output an oscillator output signal. The circuit is configured to adjust a capacitance of the LC tank to different values, detect an amplitude of the oscillator output signal for each value of the different values of the capacitance while an input signal having a target frequency is applied to the injection locking input, determine a maximum amplitude of the detected amplitudes, and select a value for operating the injection locked oscillator based on the determined maximum amplitude.

27 Claims, 9 Drawing Sheets

CALIBRATING AN INJECTION LOCKED OSCILLATOR

FIELD

The present disclosure relates to a circuit and a method for calibrating an injection locked oscillator, an injection locked oscillator including such a circuit, a frequency multiplier, a frequency divider and an amplifier including such an injection locked oscillator.

BACKGROUND

Injection locked oscillators may be used in different electronic circuits such as frequency multipliers, frequency dividers and amplifiers.

Generally, an injection locked oscillator may be based on a cross-coupled LC oscillator. FIG. 1 shows a schematic view of an injection locking oscillator 14 comprising an injection stage 20 and a cross-coupled LC oscillator 22. Injection stage 20 comprises a differential injection locking input with terminals in+ and in−. Terminal in+ is coupled to the gate of a first injection transistor 30 via a coupling capacitor and terminal in− is coupled to the gate of a second injection transistor 32 via a coupling capacitor. The sources of injection transistors 30, 32 are coupled to a reference potential, such as ground, and the gates of injection transistors 30 and 32 are biased using resistors and a bias voltage $V_b$. Biasing injections transistors 30, 32 in this manner provides a current source coupled to the sources thereof. Injection transistors 30 and 32 convert a voltage at the gates thereof to a voltage at the drain terminals thereof.

The drain terminals of injection transistors 30 and 32 are coupled to injection nodes IN1 and IN2 of LC oscillator 22. LC oscillator 22 comprises inductors L1, L2 and capacitors C1, C2. A parallel circuit of L1 and C1 is coupled between IN1 and a reference potential. A parallel circuit of L2 and C2 is coupled between IN2 and the reference potential. LC oscillator 22 further comprises transistors 40 and 42. Transistors 40 and 42 are cross coupled in that the gate of transistor 40 is coupled to IN2, the gate of transistor 42 is coupled to IN1, the drain of transistor 40 is coupled to IN1, the drain of transistor 42 is coupled to IN2, and the sources of transistors 40 and 42 are coupled together and connected to a current source $I_{OSC}$. A first terminal out+ of a differential output of the injection locked oscillator 14 is coupled to IN1 and a second terminal out-of the differential output of the injection locked oscillator 14 is coupled to IN2.

The injection transistors 30, 32 inject a current inside the LC oscillator 22 via nodes IN1 and IN2. LC oscillator 22 is tuned at N×flo by the combination of inductors L1, L2 and capacitors C1, C2. Inductors L1, L2 and capacitors C1, C2 form a LC tank. Generally, the capacitance of the LC tank is realized by the sum of explicit capacitors and parasitic capacitors, such as parasitic capacitances due to the active devices connected to the output nodes. The parasitic capacitors may vary with process conditions. Thus, the oscillation frequency of the LC oscillator may vary and may deviate from N×flo. If the oscillation frequency is not exactly N×flo, the locking range is to be made wide enough to fulfill the bandwidth requirements of targeted applications and to take into account process variations that detune the oscillation frequency of the LC oscillator. One common approach to deal with this is to use a frequency tracking loop that sets the oscillator central frequency exactly to N×flo. Such approaches use a main VCO, voltage controlled oscillator, which is injection locked and a replica VCO which is not injection locked. A frequency-locked loop, FLL, or a phase-locked loop, PLL, which includes the replica VCO keeps monitoring instantaneous drifts of the main VCO's frequency and adjusts a control voltage thereof to keep the precise target frequency N×flo. The main issues with such approaches are mismatches between the VCOs due to process variations and increased power consumption and area consumption due the presence of two VCOs. In other common approaches, two quadrature VCOs are injected at the same time and a frequency tracking loop is used to bring the oscillators to the correct central frequency. Again, two oscillators are employed, yielding increased area and power consumption.

Injection locked oscillators may be used in frequency multipliers to reduce unwanted harmonics in output signals of the frequency multipliers. Frequency multipliers are key building blocks in communication/radar systems since, generally, a frequency flo of a local oscillator, LO, may be lower than a desired carrier frequency fout. Therefore, the purpose of the frequency multiplier is to produce at an output thereof the desired frequency fout=N×flo, wherein N is the multiplication factor, generally an integer ≥2. The output signal of the frequency multiplier should include a single-harmonic only at the frequency fout while the other harmonics should be suppressed as much as possible. In addition, the gain of the frequency multiplier should be as high as possible and the power consumption should be as low as possible. Among different possible architectures, injection locked multipliers promise a good efficiency and are able to naturally reject harmonics other than the desired harmonic at fout.

FIG. 2 shows an example of an injection locked frequency multiplier. The injection locked frequency multiplier comprises a local oscillator, LO, 10, a harmonics generator 12 and the injection locked oscillator 14. Sometimes, the injection locked oscillator 14 is also called injection locking oscillator.

In the present disclosure, examples of respective circuitries are described referring to differential signals. It is, however, clear for those skilled in the art that corresponding circuitries could also be implemented using single-ended signals.

LO 10 generates an output signal at LO frequency flo. An input of harmonics generator 12 is coupled to the output of LO 10 and receives the output signal of LO 10 at frequency flo. Harmonics generator 12 generates the Nth harmonic at frequency fout=N×flo. The output of the harmonics generator 12 is coupled to an injection locking input of injection locked oscillator 14. Thus, the output of the harmonics generator 12 is employed to lock the injection locked oscillator 14. Generally, the resonant frequency of the injection locked oscillator 14 is adjusted to the frequency of the output signal of harmonics generator 12. Thus, ideally, at the output of the injection locked oscillator an output signal with the desired harmonic fout is produced, while all other harmonics are suppressed with infinite harmonic rejection.

Accordingly, there is still room for improvements to achieve robust injection over process, voltage and temperature variations.

SUMMARY

Examples of the present disclosure provide a circuit for calibrating an injection locked oscillator, the injection locked oscillator including an injection locking input, a LC tank and an oscillator output to output an oscillator output signal. The circuit is configured to adjust a capacitance of the LC tank to different values, to detect an amplitude of the oscillator output signal for each value while an input signal having a target frequency is applied to the injection locking input, to determine the maximum amplitude of the detected amplitudes, and to select a value for operating the injection locked oscillator based on the determined maximum amplitude.

Examples of the present disclosure provide a method of calibrating an injection locked oscillator including a LC tank. An input signal having a target frequency is applied to an injection locking input of the injection locked oscillator. A capacitance of the LC tank is adjusted to different values. An amplitude of an output signal of the injection locked oscillator is detected for each value while the input signal having the target frequency is applied to the injection locking input. The maximum amplitude of the detected amplitudes is determined and a value for operating the injection locked oscillator is selected based on the determined maximum amplitude.

Accordingly, examples of the present disclosure provide a new calibration principle that can be applied to injection locked oscillators to tune their center frequency. The calibration is performed by looking at the amplitude at the output of the oscillator itself. Selecting a value for operating the injection locked oscillator based on a determined maximum amplitude permits the oscillation frequency of the oscillator to be as close as possible to the frequency of the input signal applied to the injection locking input. Thus, in examples, robust injection locking may be achieved over process, voltage and temperature variations, PVT variations. Accordingly, examples provide simple and effective calibration techniques to ensure proper locking over such variations.

BRIEF DESCRIPTION OF THE DRAWINGS

Examples of the disclosure will be described using the accompanying drawings, in which.

DETAILED DESCRIPTION

In the following, examples of the present disclosure will be described in detail using the accompanying drawings. It is to be pointed out that the same elements or elements that have the same functionality are provided with the same or similar reference numbers, and that a repeated description of elements provided with the same or similar reference numbers is typically omitted. Hence, the descriptions provided for elements having the same or similar reference numbers are mutually exchangeable. In the following description, a plurality of details is set forth to provide a more thorough explanation of examples of the disclosure. However, it will be apparent to one skilled in the art that other examples may be practiced without these specific details. In other instances, well-known structures and devices are shown in block diagram form rather than in detail in order to avoid obscuring examples described herein. In addition, features of the different examples described herein may be combined with each other, unless specifically noted otherwise.

Figure 3:
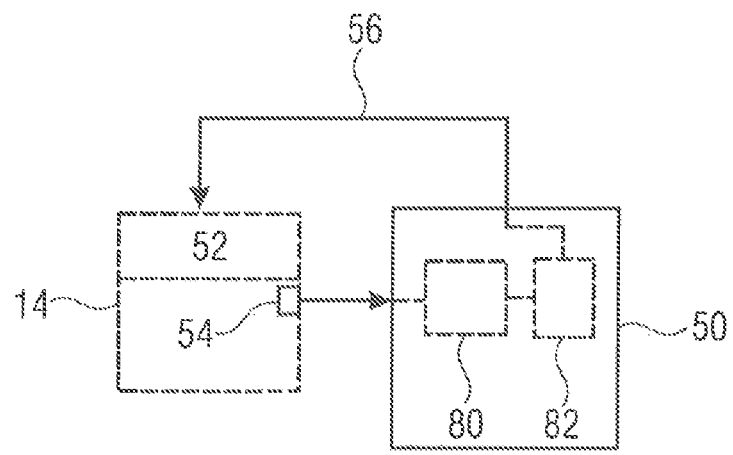
FIG. 3 shows a schematic view of an example of a circuit for calibrating an injection locked oscillator.

FIG. 3 shows a schematic view of a circuit 50 for calibrating an injection locked oscillator 14. In some embodiments, the injection locked oscillator may be a part of circuitry 50. In other embodiments, the injection locked oscillator may not form part of the circuit 50. In view of this, the injection locked oscillator is shown in broken lines in FIG. 3. The injection locked oscillator 14 may be a voltage controlled oscillator, VCO, and comprises a LC tank 52 and an oscillator output 54 to output an oscillator output signal. The LC tank 52 may comprise switchable capacitors so that the capacitance of the LC tank 52, and, therefore, the resonance frequency of the oscillator 14 may be adjusted by applying switching signals to the switchable capacitors. The switching signals may be based on a control signal applied to oscillator 14. The switching signals may activate or deactivate one or more of the switchable capacitors for obtaining a capacitance.

Circuit 50 is configured to adjust a capacitance of the LC tank 52 to different values. To this end, circuit 50 may be configured to apply a control signal 56 to a control input of oscillator 14. Circuit 50 is coupled to the oscillator output 54 and is configured to detect an amplitude of the oscillator output signal for each of the different values to which the capacitance of the LC tank is adjusted, while an input signal having a target frequency is applied to an injection locking input of the injection locked oscillator. Circuit 50 is to determine the maximum amplitude of the detected amplitudes and to select a value for operating the injection locked oscillator based on the determined maximum amplitude. To be more specific, circuit 50 may be configured to adjust the capacitance of the LC tank to the corresponding value during the normal operation of the injection locked oscillator in the field. In examples, circuit 50 may be configured to perform such a calibration when the injection locked oscillator or a circuit providing the input signal to the injection locking input of the injection locked oscillator is powered up. In examples, circuit 50 may be configured to conduct the calibration after a predetermined operation time, such as periodically after expiration of a predetermined operation time.

In examples, the calibration may be implemented as follows. When the injection locked oscillator and a circuit providing the input signal to the injection locked oscillator is turned on, the input signal having the target frequency is injected into the injection locked oscillator 14. The capacitance of the LC tank 52 is adjusted to different values and for each value the oscillator output amplitude is measured. Circuit 50 may be configured to determine a value associated with the maximum amplitude and to select a value for operating the injection locked oscillator based on the determined maximum amplitude. In some embodiments, the selected value may be the value associated with the maximum amplitude as the value for operating the injection locked oscillator 14. In some embodiments, the selected value may be determined based on a fitting of the measured values to a model curve such that the model curve predicts a maximum amplitude for the selected value compared to other adjustable values. Thus, it may be ensured that the injection locked oscillator 14 is centered at the target frequency and normal operation can start. In examples, circuit 50 comprises a peak detector 80 configured to detect the amplitude of the oscillator output signal for each value to which the capacitance of the LC tank 52 is adjusted. Thus, the amplitude can be detected in a simple manner. In examples, circuit 50 comprises a control circuit 82 to generate control signal 56 based on the amplitudes detected by peak detector 80.

In examples, circuit 50 is configured to apply different digital control words to a capacitor bank of the LC tank to adjust the capacitance of the LC tank to different values. Thus, the capacitance of the LC tank can be adjusted to the appropriate value in a simple manner. In examples, circuit 50 may be configured to adjust the capacitance of the LC tank to values resulting in a resonance frequency of the LC tank in a frequency range of the target frequency ±15%. Thus, in examples, the circuit permits compensation of corresponding deviations of the frequency of the oscillator frequency from a target frequency.

Figure 4:
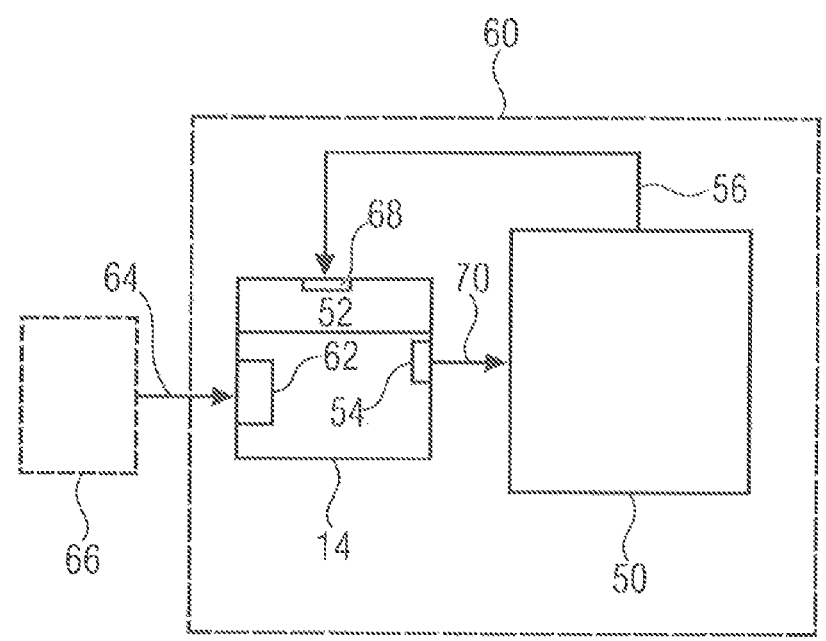
FIG. 4 shows a schematic view of a circuitry comprising an injection locked oscillator and a circuit for calibrating the injection locked oscillator.

FIG. 4 shows a schematic view of an injection locked oscillator circuit 60 comprising the injection locked oscillator 14 and the circuit 50 for calibrating the injection locked oscillator 14. The injection locked oscillator 14 comprises an injection locking input 62 to receive an input signal 64 having a target frequency. The input signal 64 may be received from an input signal providing circuit 66. In examples, the input signal providing circuit 66 may be a frequency multiplier or a frequency divider. The injection locked oscillator 14 comprises the LC tank 52 having an adjustable capacitance and a control input 68 to receive the control signal 56 from circuit 50 to adjust the capacitance of LC tank 52. Oscillator 14 further comprises the oscillator output 54 to output oscillator output signal 70 to the circuit 50. Circuit 50 is configured to adjust the capacitance of the LC tank as explained above in order to calibrate the oscillation frequency of the oscillator to the target frequency.

Examples of the present disclosure further provide a frequency multiplier comprising a LO configured to output a LO signal having a LO frequency, a harmonic generator coupled to the LO to receive the LO signal and configured to generate at an output thereof a generator output signal at a frequency which is a multiple of the LO frequency, and an injection locked oscillator as disclosed herein. Thus, in examples, the input signal providing circuit 66 may be implemented by a LO and a harmonic generator.

Examples of the present disclosure also provide a frequency divider comprising a LO configured to output a LO signal having a LO frequency, a divider circuit coupled to the LO to receive the LO signal and configured to generate at an output thereof a divider circuit output signal at a frequency which is a fraction of the LO frequency, and an injection locked oscillator as described herein. Thus, in examples, input signal providing circuit 66 may be implemented by a LO and a divider circuit coupled to the LO.

Examples further provide an amplifier comprising an injection locked oscillator as described herein. Thus, in examples, the input signal providing circuit 66 provides an input signal to be amplified by the injection locked oscillator, which is implemented to provide at an output thereof an amplified version of the input signal.

Figure 5:
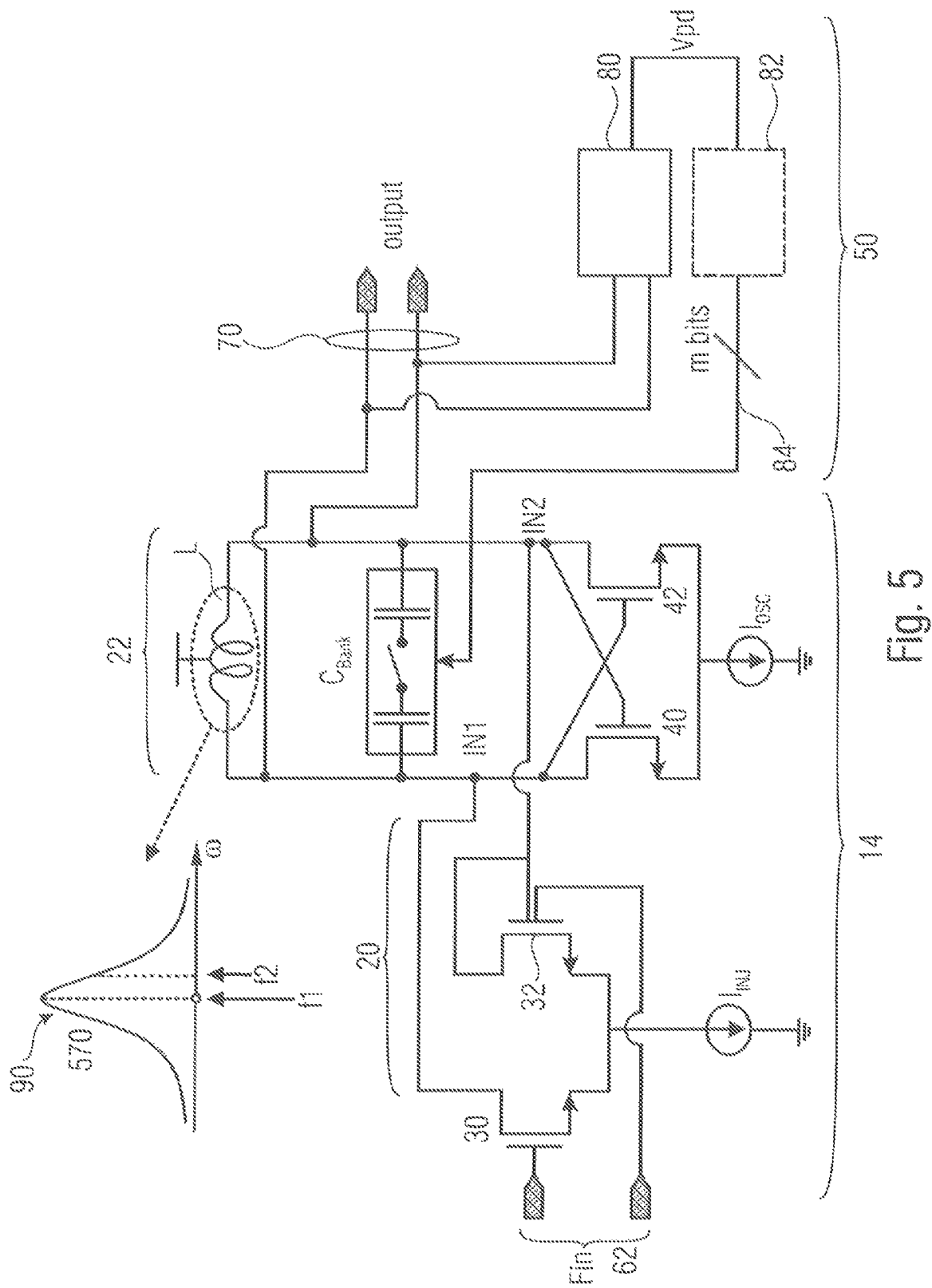
FIG. 5 shows a circuit diagram of an example of an injection locked oscillator.

An example of an injection locked oscillator circuit according the present disclosure is now described referring to FIG. 5. The injection locked oscillator circuit comprises injection locked oscillator 14 and circuit 50 for calibrating the injection locked oscillator 14. Injection locked oscillator 14 comprises injection stage 20 and voltage controlled oscillator 22. Injection stage 20 comprises a differential injection locking input 62 receiving an input signal at a target frequency Fin. Injection locking transistors 30 and 32 are biased by current source $I_{INJ}$, convert a voltage at injection locking input 62 to a current and inject the current at Fin into the oscillator 22. Oscillator 22 comprises an LC tank including an inductance L and a capacitor bank $C_{Bank}$. Oscillator 22 further comprises cross-coupled transistors 40, 42 biased by current source $I_{OSC}$. While shown as a single inductance, inductance L may be formed by a plurality of inductances. Capacitor bank $C_{Bank}$ may comprise switched capacitors allowing the capacitance of the LC tank to be adjusted.

Figure 1:
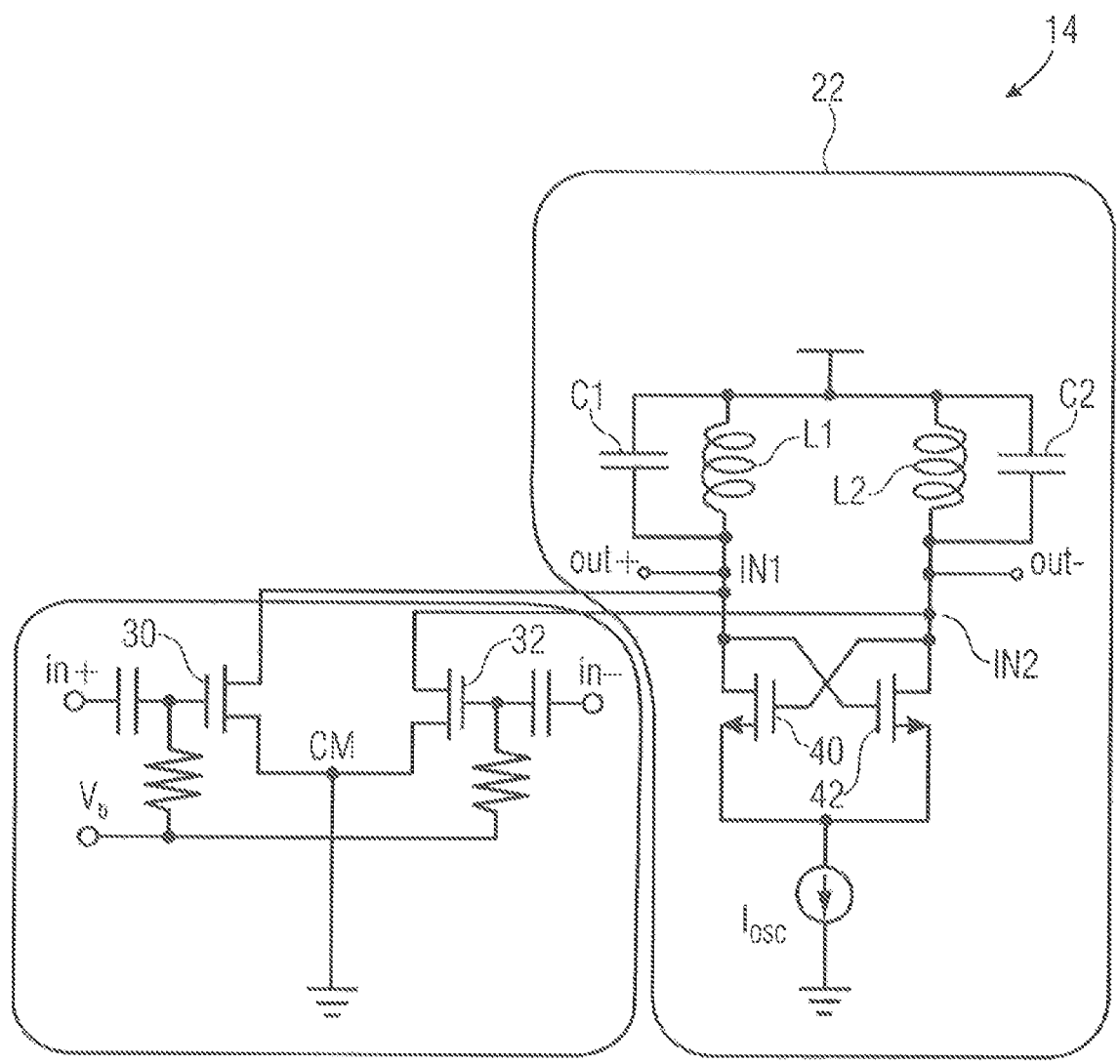
FIG. 1 shows a schematic diagram of a frequency multiplier comprising an injection locked oscillator.
Figure 2:
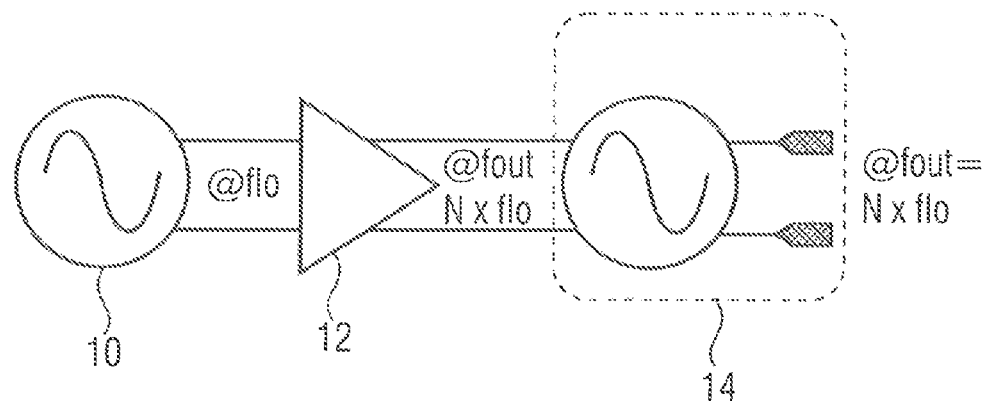
FIG. 2 shows a circuit diagram of an example of an injection locked oscillator.

As shown in FIG. 5, drain terminals of injection transistors 30, 32 are coupled to injection nodes IN1 and IN2 to inject the injection current into the LC tank of oscillator 22. Transistors 40 and 42 are connected as explained above with reference to FIG. 2. Terminals of differential oscillator output 70 are coupled to nodes IN1 and IN2, respectively. Circuit 50 comprises peak detector 80 and control circuit 82. Peak detector 80 is coupled to oscillator output 70, receives the output signal at oscillator output 70 and detects amplitudes Vpd of the output signal. Control circuit 82 is coupled to peak detector 80 and the detected amplitudes Vpd are supplied to control circuit 82. Control circuit 82 is configured to output a control signal to capacitor bank $C_{Bank}$ in order to adjust the capacitance thereof. In examples, control circuit 82 may be configured to output a digital control word comprising m bits to a control input of capacitor bank $C_{Bank}$. Control circuit 82 is configured to sweep the control word of oscillator capacitor bank $C_{Bank}$ and peak detector 80 is configured to detect the amplitude of the oscillator output 70 for each control word. Control circuit 82 is configured to determine the maximum amplitude from the amplitudes Vpd and, after calibration, to operate oscillator 22 using the control word associated with the maximum amplitude.

Inset 90 in FIG. 5 shows an admittance profile S70 of the LC tank comprising L and $C_{Bank}$. If the oscillator tank is centered at the input frequency Fin, f1 in inset 90, the output amplitude at output 70 is maximum. If, due to process variations, the oscillator is mistuned and centered, for example, at f2, then the output amplitude is not maximum anymore, as can be easily foreseen by the LC tank admittance profile S70 of FIG. 5. This behavior is leveraged to calibrate the central frequency of the oscillator as close as possible to the input frequency Fin. To this end, control circuit 82 determines the capacitance setting revealing the maximum amplitude and uses this setting to operate oscillator 22 after calibration. The control circuit 82 may be implemented as a digital control circuit and may include an analog digital converter, ADC, to convert analog input signals Vpd to the digital domain. Moreover, control circuit 82 may output a digital control signal to control the capacitor bank.

The calibration may be implemented as explained below. When the circuit providing the input signal at injection locking input 62 is turned on, the input signal at Fin is injected into the oscillator 22. The digital control word 84, by which the capacitor bank $C_{Bank}$ is controlled, is swept. For each word, peak detector 80 measures the oscillator output amplitude, which may be sampled by an analog digital converter of control circuit 82. A simple algorithm may select the word that gives the maximum oscillation amplitude. After calibration, this word is used to operate the injection controlled oscillator. By selecting the control word associated with the maximum amplitude, one may ensure that the voltage controlled oscillator 22 is centered at Fin as close as possible at normal operation.

Figure 6:
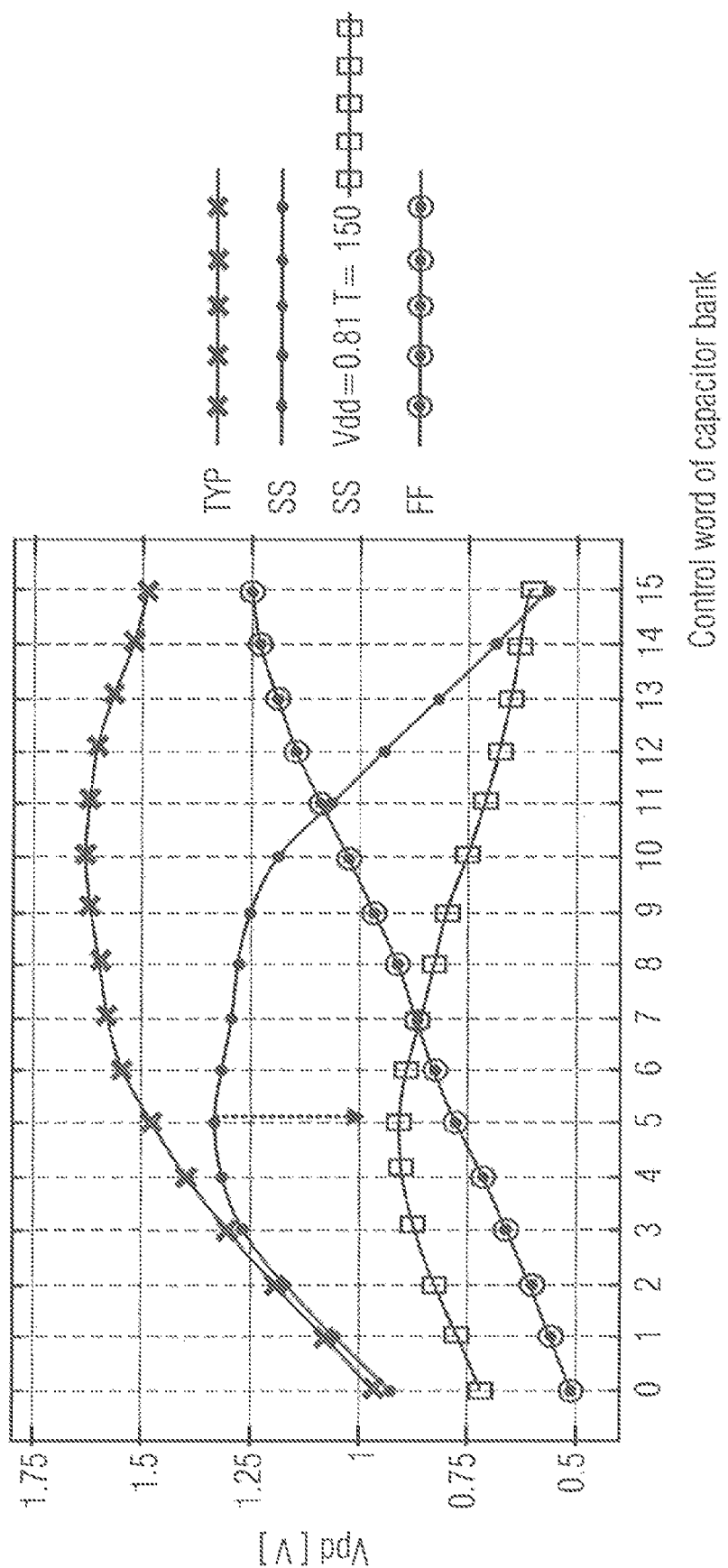
FIG. 6 shows a diagram of examples of peak detector outputs as functions of capacitor bank control words for different process corners.

FIG. 6 shows an example of outputs Vpd of peak detector 80 as a function of the capacitor bank control word 84 for different process corners. Curve TYP shows the result for a typical process corner, where the best word is 10. Curve SS shows the output for a slow case, in which parasitics result in a reduction of the oscillator frequency, in which the best word is 5. Curve FF shows the output for a fast case, in which parasitics result in an increase of the oscillator frequency, wherein the best word is 15. As it is shown by curve $SS_x$, in FIG. 6, the best control word does not change substantially with the supply voltage Vdd and the temperature. It can be seen from curve SSx that the best control word for the SS case is the same if Vdd is reduced by 10% and the temperature is increased from 27 to 150°. This shows that a calibration according to the present disclosure is very robust.

In examples, control circuit 82 may use an existing analog digital converter provided for other purposes to sense amplitudes and to do self-testing. This may help further reducing the area and power consumption overhead.

Figure 7:
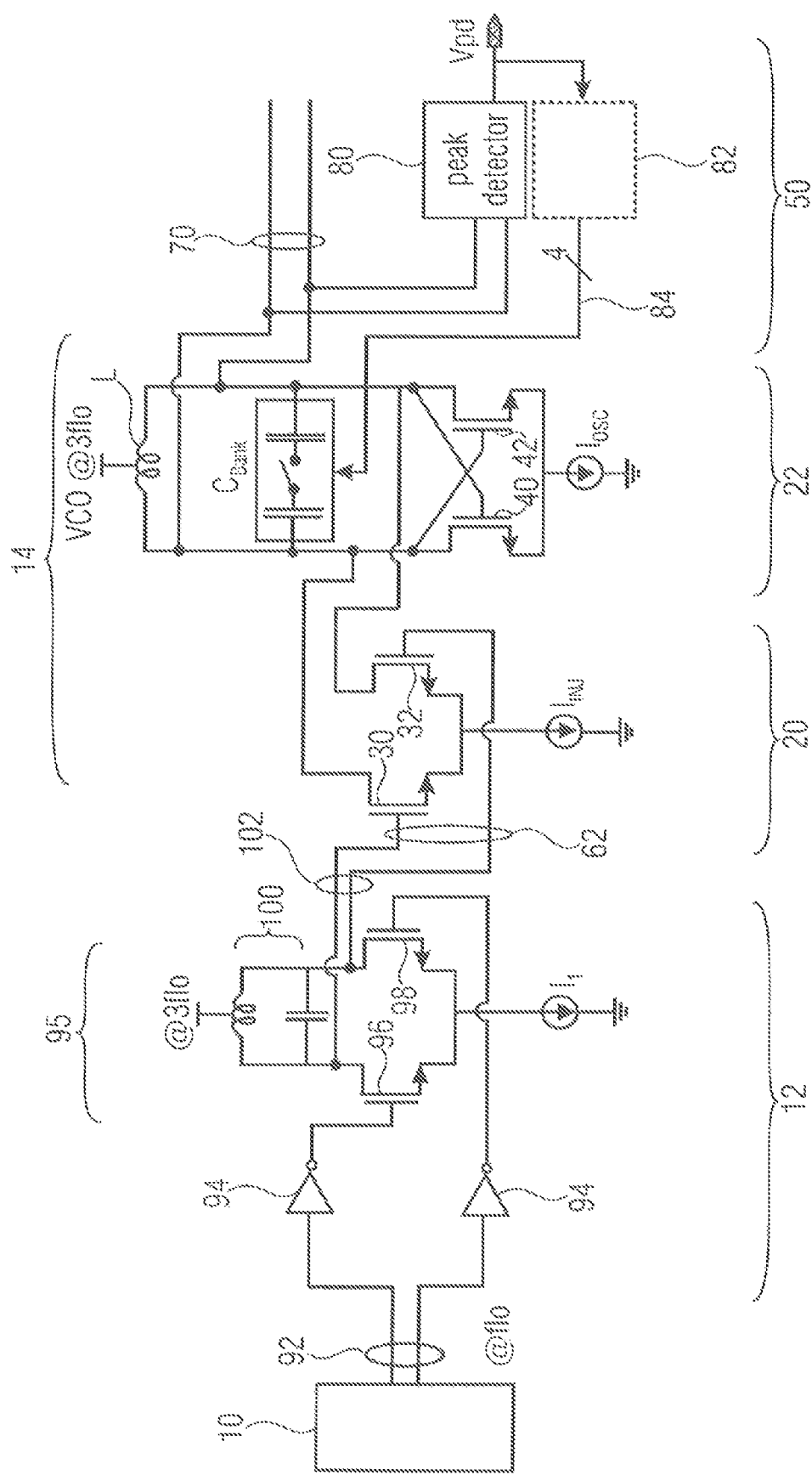
FIG. 7 shows a circuit diagram of an example of an injection locked frequency multiplier.

A circuit diagram of an example of a frequency multiplier according to the present disclosure is shown in FIG. 7. The frequency multiplier comprises LO 10 outputting a signal at frequency flo at an output 92 thereof. The multiplier further comprises harmonics generator 12, injection locked oscillator 14 and a calibrating circuit 50. The harmonics generator 12 comprises inverters 94 and an LC loaded amplifier 95. The LC loaded amplifier comprises transistors 96 and 98 and a LC load 100 and is biased at Ii. An output 102 of the harmonics generator is coupled to the injection locking input 62 of the injection stage 20.

The multiplier shown in FIG. 7 represents a frequency multiplier by 3. The signal at flo, which is output by LO 10, is fed to the inverters 94 to enhance the third harmonic content which is amplified by the LC-loaded amplifier 95. The amplified third harmonic is output at 102 and is injected into the oscillator 14. The central frequency of the oscillator 14 is tuned using the calibration circuit 50 as described above. As shown in FIG. 7, the signal at the output 102 is at a frequency 3flo, and the oscillator 22 is tuned to the same frequency 3flo.

It is to be noted that the harmonics generator may be implemented in many different ways. In examples, the harmonics generator may be implemented using a phase generator configured to provide versions of an oscillation signal phase-shifted with respect to each other and a combiner configured to combine the phase-shifted versions of the oscillation signal to generate a signal having a frequency which is a multitude of the frequency of the oscillation signal.

While a multiplication factor N of three is shown in FIG. 7, the present disclosure may be applied to other multiplication factors N. In addition, the present disclosure may be applied outside the frequency multiplier area, such as in frequency dividers or amplifiers.

Generally, the capacitor bank may be implemented using switched capacitors allowing the capacitance of the LC tank to be adjusted in an appropriate range, such as tune the resonance frequency of the LC tank in a frequency range of the target frequency ±15%. In examples, the capacitor bank may comprise a number of cells of capacitors, which may be switched into and out of the capacitor bank. FIGS. 5 and 7 show a single cell of capacitors switchable into the LC tank for viewing purposes only. In implementations, the capacitor bank may comprise a number of cells dependent on a desired precision. In examples, the VCO may comprise between 10 and 30 cells. Each cell may comprise a single capacitor or a series connection of two or more capacitors that may be coupled in parallel to an inductor using a switch. Each switch may be controlled using one bit of the digital word from control circuit 82. In examples, capacitors may be coupled between nodes IN1 and IN2 in this manner using the digital control word 84 from control circuit 82.

Figure 8:
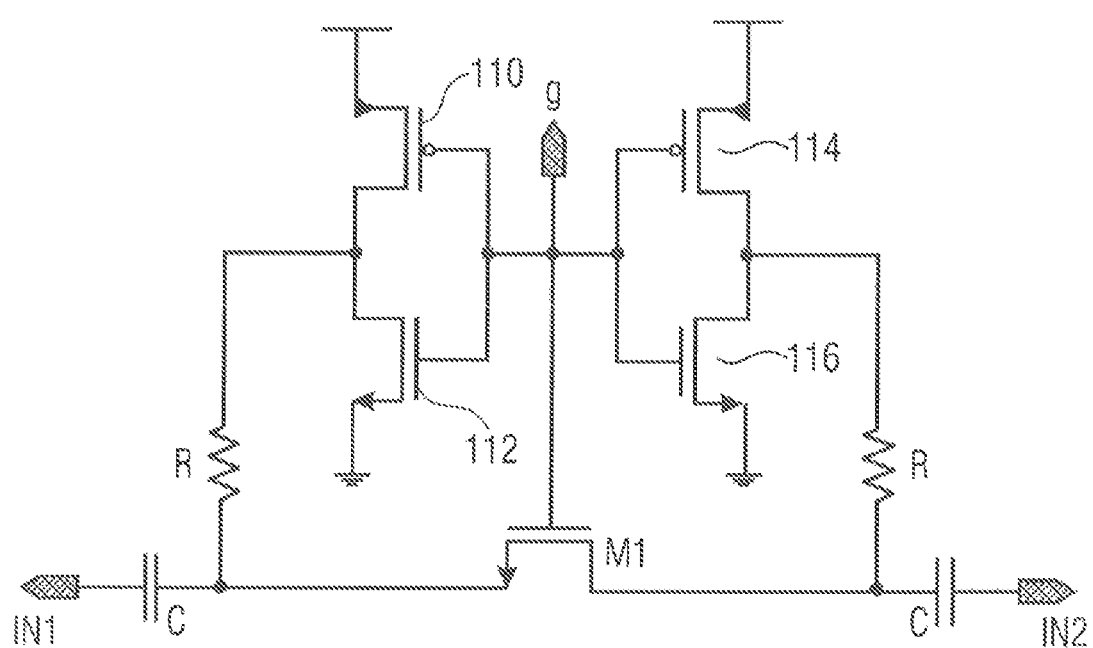
FIG. 8 shows a circuit diagram of an example of a single cell of a capacitor bank.

A circuit diagram of an example of a single cell of a capacitor bank is shown in FIG. 8.

The cell comprises two capacitors C and a switch M1. If switch M1 is off, the capacitors C are not connected between nodes IN1 and IN2. If switch M1 is closed, capacitors C are connected between nodes IN1 and IN2. Transistors 110, 112, 114 and 116 and resistors R are connected in the manner shown in order to apply control signal g to the gate of switch M1. The cell of a capacitor bank shown in FIG. 8 is designed such that the overall tank quality factor is not affected and remains substantially constant for the different setting of different capacitance values based on the digital control word. In this way, the peak amplitude depends on the LC tank central frequency only, that therefore can be properly detected during calibration.

Figure 9:
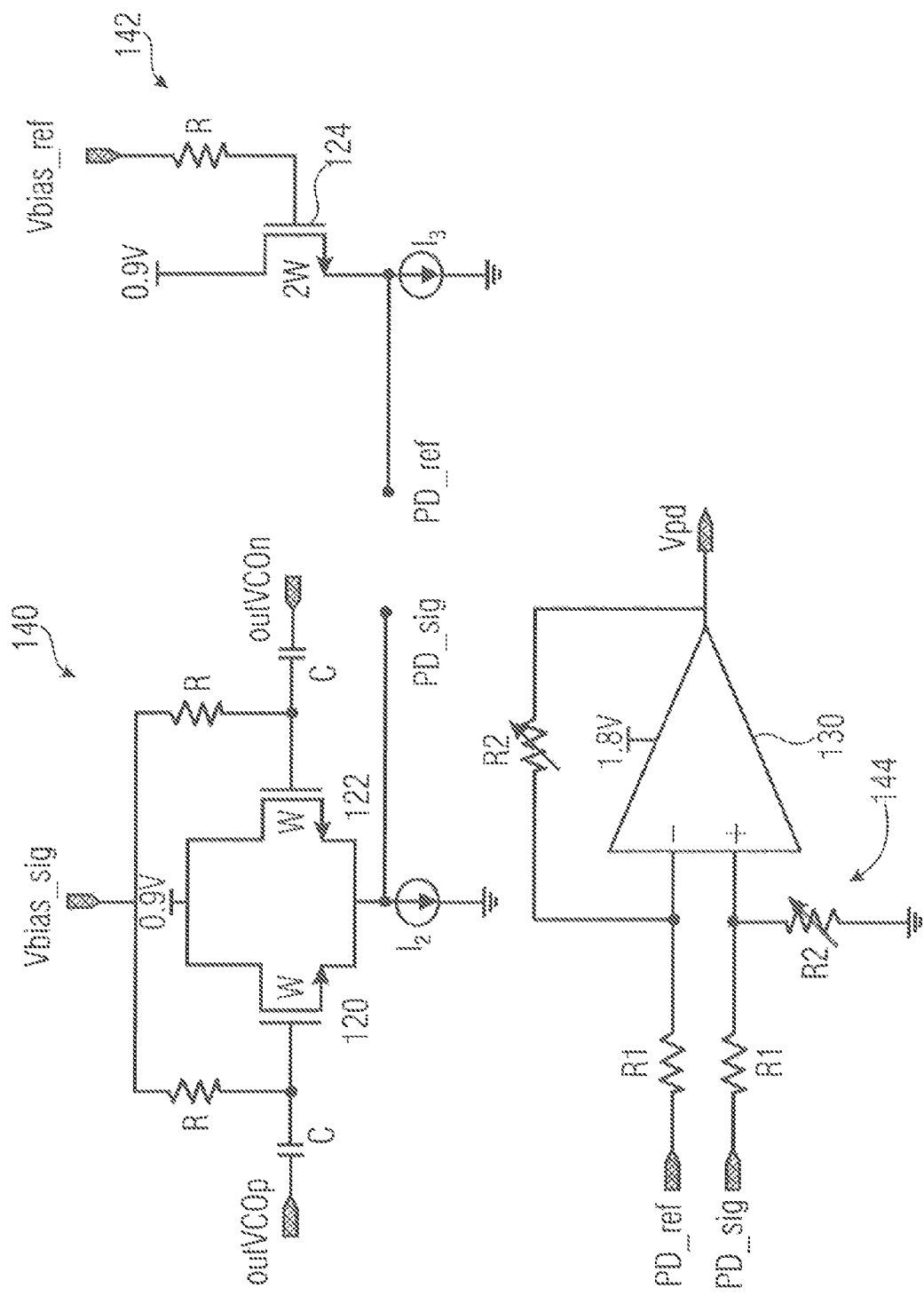
FIG. 9 shows a circuit diagram of an example of a peak detector.

FIG. 9 shows an example of a peak detector circuit. The peak detector circuit comprises a peak detector 140, a dummy peak detector 142, and an instrumentation amplifier 144. Terminals outVCOp and outVCOn of peak detector 140 are coupled to the terminals of the differential output 70 of oscillator 14. These terminals are coupled to gates of transistors 120, 122 via coupling capacitors C. Moreover, the gates of transistors 120 and 122 are coupled to a bias voltage Vbias_sig via resistors R. The drains of transistors 120, 122 are commonly connected to a reference voltage, such as 0.9 Volt. The sources of transistors 120, 122 are coupled to ground via current source 12. The amplifier outputs a signal proportional to the amplitude at outVCOp and outVCOn at a terminal PD_sig.

Dummy peak detector 142 comprises a transistor 124, a resistor R and a current source $I_3$. A reference voltage PD_ref is generated using transistor 124, the gate of which is coupled to a bias voltage Vbias_ref via resistor R. The drain of transistor 124 is coupled to a reference voltage, such as 0.9 volt and the source terminal thereof is coupled to ground via current source $I_3$. The reference voltage PD_ref is output at the source of transistor 124.

Instrumentation amplifier 144 comprises a differential amplifier 130 and resistors R1, R2. Signals PD_ref and PD_sig are applied to the inverting and non-inverting inputs of differential amplifier 130 via resistors R1. The output of differential amplifier 130 is fed back to the inverting input thereof via a variable resistor R2. The non-inverting input of differential amplifier 130 is connected to ground via a variable resistor R2. At the output of differential amplifier 130, a signal corresponding to the amplitude of the signal applied to outVCOp and outVCOn is output.

Thus, according to the example shown in FIG. 9, the output of peak detector 140 is amplified by instrumentation amplifier 144. Dummy peak detector 142 is used as a reference. The output Vpd of the instrumentation amplifier is the signal fed to the control circuit, such as control circuit 82 in FIGS. 5 and 7.

Figure 10:
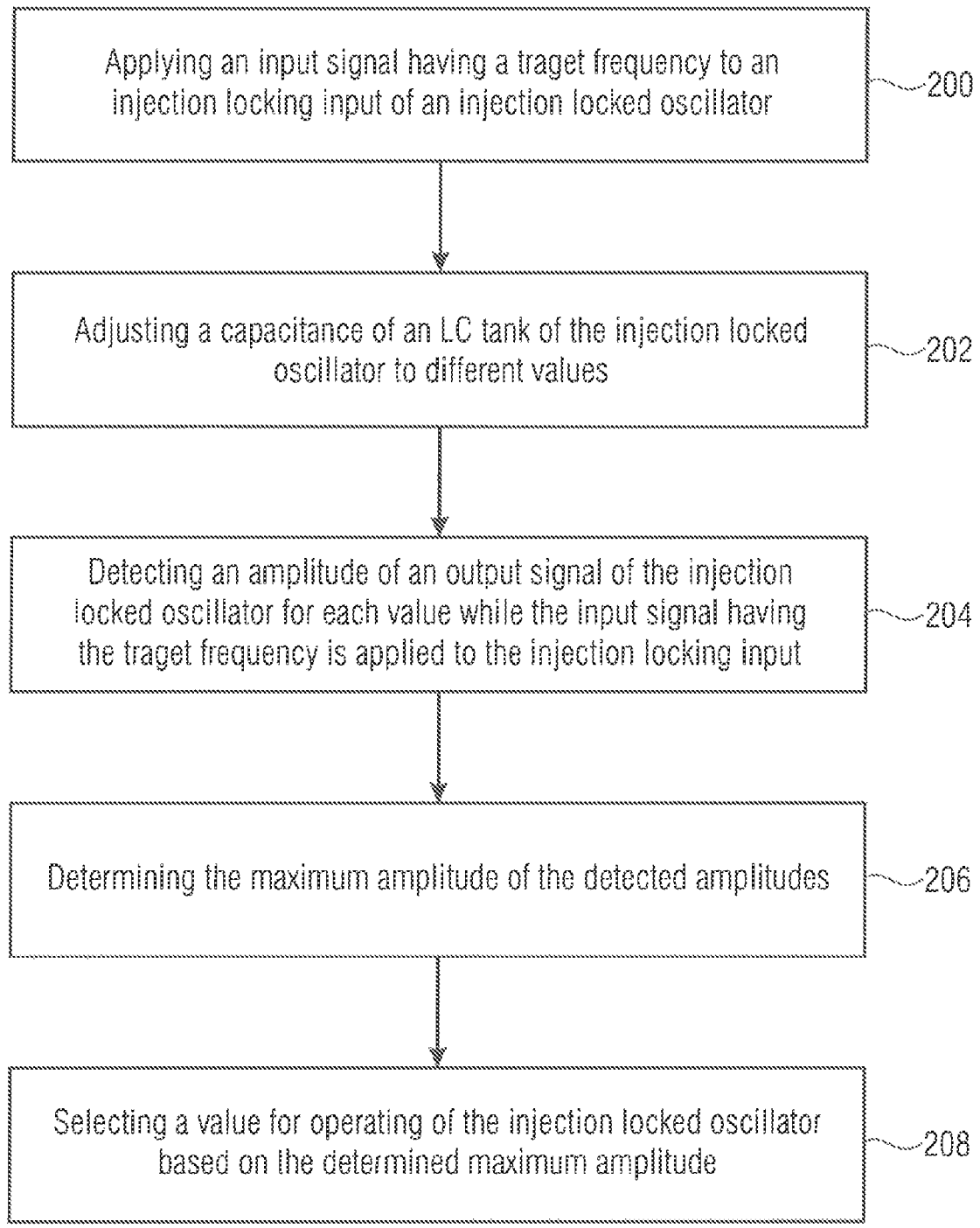
FIG. 10 shows a flow diagram of an example of a method of calibrating an injection locked oscillator.

FIG. 10 shows a flow diagram of an example of a method according to the present disclosure. At 200, an input signal having a target frequency is applied to an injection locking input of an injection locked oscillator. At 202, a capacitance of a LC tank of the injection locked oscillator is adjusted to different values. At 204, an amplitude of an output signal of the injection locked oscillator is detected for each value while the input signal having the target frequency is applied to the injection locking input. At 206, the maximum amplitude of the detected amplitudes is determined. At 208, a value for operating the injection locked oscillator is selected based on the determined maximum amplitude.

In examples, the value associated with the maximum amplitude is selected as the value for operating the injection locked oscillator upon finishing the calibration. In examples, a model can be used which tries to fit the measurement results into a modeled curve. In such examples, the selected value may deviate from the value associated with the maximum amplitude, such as if there are measurement errors.

In examples of the present disclosure, calibration is performed when a circuit providing the input signal, such as a local oscillator followed by a harmonics generator or a frequency divider, is powered up. In examples, it is sufficient to perform calibration only one time at the first power up of the circuit in case the resonance frequency of the injection locked oscillator does not depend on operation parameters such as supply voltage and temperature. In other examples, calibration may be performed whenever the circuit is powered up or whenever a predetermined operation time is reached. In such examples, the resonance frequency of the oscillator may be dynamically adjusted to changing operation parameters.

Examples of the present disclosure permit calibrating the central frequency of an injection locked oscillator without a substantial increase in area usage and without substantial increase of power consumption as in prior solutions. In particular, samples of the present disclosure permit calibration of injection locking to clean up phases and to achieve harmonic reduction in a robust manner with respect to process, voltage and temperature variations.

Examples of the present disclosure may find application in any field in which clear oscillation signals with high harmonic suppression are desired. In examples, the present disclosure may be applied to system, such as radar and communication systems, in which the local oscillator signal is often generated at a lower frequency and has to be multiplied to achieve the desired carrier frequency. In such a system, a multiplier with high harmonic rejection ratio, lower power consumption and low area consumption is desired. In particular, a high harmonic rejection is beneficial for the emission mask and the up/down conversion of undesired signals. Examples of the present disclosure may be applied to systems working at high frequency, such as frequencies beyond 35 GHz, such as 77 GHz.

In examples, the circuit for calibrating may include a peak detector and a control circuit. In examples, the peak detector may be implemented as an analogous circuitry. In examples, the control circuit may include an analog digital converter and may be implemented as a digital circuit.

In examples and unless described otherwise, the circuitry described herein may be implemented via any appropriate circuit structures, such as microprocessor circuits, application specific integrated circuits (ASICs), field programmable gate arrays (FPGAs), CMOS circuits and the like. In examples, the circuit may be implemented as a combination of hardware structures and machine-readable instructions. In examples, the circuits may comprise a processor and memory devices storing machine-readable instructions, which, when executed by the processor, result in method described herein.

In the examples described, the transistors are implemented using field effect transistors. In other examples, transistors may be implemented using bipolar transistors. In the examples described, the differential signals and corresponding differential circuitry is used. In other examples, single-ended signals and corresponding single-ended circuitry may be used.

Although some aspects have been described as features in the context of an apparatus, it is clear that such a description may also be regarded as a description of corresponding features of a method. Although some aspects have been described as features in the context of a method, it is clear that such a description may also be regarded as a description of corresponding features concerning their functionality of an apparatus.

In an aspect 1, a circuit for calibrating an injection locked oscillator, the injection locked oscillator comprises an injection locking input, an LC tank and an oscillator output to output an oscillator output signal, the circuit configured to: adjust a capacitance of the LC tank to different values; detect an amplitude of the oscillator output signal for each value while an input signal having a target frequency is applied to the injection locking input; determine the maximum amplitude of the detected amplitudes; and select a value for operating the injection locked oscillator based on the determined maximum amplitude.

In an aspect 2, the circuit of aspect 1 is configured to determine a value associated with the maximum amplitude and to select the value associated with the maximum amplitude as the value for operating the injection locked oscillator.

In an aspect 3, the circuit of aspect 1 or 2 comprises a peak detector configured to detect the amplitude of the oscillator output signal for each value.

In an aspect 4, the circuit of one of aspects 1 to 3 is configured to apply different digital control words to a capacitor bank of the LC tank to adjust the capacitance of the LC tank to different values.

In an aspect 5, the circuit of one of aspects 1 to 4 is configured to adjust the capacitance of the LC tank to values resulting in a resonance frequency of the LC tank in a frequency range of the target frequency ±15%.

In an aspect 6, an injection locked oscillator circuit comprises an injection locked oscillator to receive an input signal having a target frequency at an injection locking input thereof, the injection locked oscillator comprising an LC tank having an adjustable capacitance, a control input to receive a control signal to adjust the capacitance of the LC tank, and an oscillator output to output an oscillator output signal; and a circuit for calibrating an injection locked oscillator according to one of aspects 1 to 5, wherein the circuit for calibrating is coupled to the oscillator output and the control input of the injection locked oscillator and is configured to apply a control signal corresponding to the selected value to the control input in a normal operation of the injection locked oscillator.

In an aspect 7, a frequency multiplier comprises: a local oscillator, LO, configured to output a LO signal, having a LO frequency; a harmonic generator coupled to the LO to receive the LO signal and configured to generate at an output thereof a generator output signal at a frequency which is a multiple of the LO frequency; and an injection locked oscillator according to aspect 6 and coupled to the harmonic generator to receive the generator output signal at the injection locking input thereof.

In an aspect 8, a frequency divider, comprises: a local oscillator, LO, configured to output a LO signal, having a LO frequency; a divider circuit coupled to the LO to receive the LO signal and configured to generate at an output thereof a divider circuit output signal at a frequency which is a fraction of the LO frequency; and an injection locked oscillator according to aspect 6 and coupled to the frequency divider to receive the frequency divider output signal at the injection locking input thereof.

In an aspect 9, an amplifier comprises an injection locked oscillator according to aspect 6.

In an aspect 10, a method of calibrating an injection locked oscillator comprising an LC tank comprises the method comprises: applying an input signal having a target frequency to an injection locking input of the injection locked oscillator; adjusting a capacitance of the LC tank to different values; detecting an amplitude of an output signal of the injection locked oscillator for each value while the input signal having the target frequency is applied to the injection locking input; determining the maximum amplitude of the detected amplitudes; and selecting a value for operating of the injection locked oscillator based on the determined maximum amplitude.

In an aspect 11, the method of aspect 10 comprises determining a value associated with the maximum amplitude and selecting the value associated with the maximum amplitude as the value for operating the injection locked oscillator.

In an aspect 12, in the method of aspect 10 or 11 adjusting the capacitance of the LC tank comprising applying different digital control words to a capacitor bank of the LC tank.

In an aspect 13, the method of one of aspects 10 to 12 comprises applying a local oscillator, LO, signal, having a LO frequency to a harmonic generator to generate the input signal at the target frequency which is a multiple of the LO frequency.

In an aspect 14, the method of one of claims 10 to 12 comprises applying a local oscillator, LO, signal, having a LO frequency to a divider circuit to generate the input signal at the target frequency which is a fraction the LO frequency.

In an aspect 15, in the method of one of claims 10 to 14 adjusting the capacitance of the LC tank comprises adjusting the capacitance to values resulting in a resonance frequency of the LC tank in a frequency range of the target frequency ±15%.

In an aspect 16, in the method of one of claims 10 to 15 adjusting, detecting, determining and selecting are performed when a circuit providing the input signal is powered up or after a predetermined operation time.

In the foregoing detailed description, it can be seen that various features are grouped together in examples for the purpose of streamlining the disclosure. This method of disclosure is not to be interpreted as reflecting an intention that the claimed examples require more features than are expressly recited in each claim. Rather, as the following claims reflect, inventive subject-matter may lie in less than all features of a single disclosed example. Thus, the following claims are hereby incorporated into the detailed description, where each claim may stand on its own as a separate example. While each claim may stand on its own as a separate example, it is to be noted that, although a dependent claim may refer in the claims to a specific combination with one or more other claims, other examples may also include a combination of the dependent claim with the subject-matter of each other dependent claim or a combination of each feature with other dependent or independent claims Such combinations are proposed herein unless it is stated that a specific combination is not intended. Furthermore, it is intended to include also features of a claim to any other independent claim even if this claim is not directly made dependent on the independent claim.

The above-described examples are merely illustrative for the principles of the present disclosure. It is understood that modifications and variations of the arrangements and the details described herein will be apparent to others skilled in the art. It is the intent, therefore, to be limited only by the pending patent claims and not by the specific details presented by way of description and explanation of the examples herein.

LIST OF REFERENCE SIGNS

10 local oscillator
12 harmonics generator
14 injection locked oscillator
20 injection stage
22 LC oscillator
30, 32 injection transistors
IN1, IN2 injection nodes
L1, L2 inductors
C1, C2 capacitors
in+, in− differential input
$I_{OSC}$ current source
50 calibration circuit
52 LC tank
54 oscillator output
56 control signal
60 injection locked oscillator circuit
62 injection locking input
64 input signal
66 input signal providing circuit
68 control input
70 oscillator output signal
$I_{INJ}$, $I_{OSC}$ current sources
L inductance
S70 oscillator output signal
80 peak detector
82 control circuit
84 digital control word
90 inset
92 local oscillator output
94 inverters
95 LC loaded amplifier
96, 98 transistors
100 LC load
102 harmonics generator output
110, 112, 114, 116 transistors of capacitor bank cell
M1 switch
C capacitors
R resistors
g control signal
120, 122 peak detector transistors
$E_2$, $E_3$ current sources
130 differential amplifier
140 peak detector
142 dummy peak detector
144 instrumentation amplifier

What is claimed is:

1. A circuit configured to calibrate an injection locked oscillator, the injection locked oscillator comprising an injection locking input, an LC tank, and an oscillator output configured to output an oscillator output signal, the circuit configured to:
   adjust a capacitance of the LC tank to different values while the injection locked oscillator is turned on;
   while the injection locked oscillator is turned on, detect an amplitude of the oscillator output signal for each value of the different values of the capacitance while an input signal having a target frequency is applied to the injection locking input;
determine a maximum amplitude based on the detected amplitudes; and
select a value for operating the injection locked oscillator based on the determined maximum amplitude.

2. The circuit of claim 1, wherein the circuit is configured to determine a value associated with the maximum amplitude and to select the value associated with the maximum amplitude as the value for operating the injection locked oscillator.

3. The circuit of claim 1, further comprising:
a peak detector configured to detect the amplitude of the oscillator output signal for each value of the different values of the capacitance.

4. The circuit of claim 3, wherein the peak detector is directly coupled to the oscillator output for receiving the oscillator output signal.

5. The circuit of claim 1, wherein the circuit is configured to apply different digital control words to a capacitor bank of the LC tank to adjust the capacitance of the LC tank to the different values.

6. The circuit of claim 1, wherein the circuit is configured to adjust the capacitance of the LC tank to the different values resulting in a resonance frequency of the LC tank in a frequency range of ±15% of the target frequency.

7. The circuit of claim 1, wherein the injection locked oscillator comprises cross-coupled transistors that enable an oscillator function of the injection locked oscillator, wherein the cross-coupled transistors are turned on while the injection locked oscillator is turned on such that the oscillator function is enabled.

8. An injection locked oscillator circuit, comprising:
an injection locked oscillator configured to receive an input signal having a target frequency at an injection locking input thereof, the injection locked oscillator comprising an LC tank having an adjustable capacitance, a control input configured to receive a control signal to adjust the capacitance of the LC tank, and an oscillator output configured to output an oscillator output signal; and
a circuit configured to calibrate the injection locked oscillator while the injection locked oscillator is turned on, wherein the circuit is configured to:
adjust a capacitance of the LC tank to different values while the injection locked oscillator is turned on,
while the injection locked oscillator is turned on, detect an amplitude of the oscillator output signal for each value of the different values of the capacitance while an input signal having a target frequency is applied to the injection locking input,
determine a maximum amplitude of the detected amplitudes, and
select a value for operating the injection locked oscillator based on the determined maximum amplitude, and
wherein the circuit is coupled to the oscillator output and the control input of the injection locked oscillator, and is configured to apply a control signal corresponding to the selected value to the control input in a normal operation of the injection locked oscillator.

9. The injection locked oscillator circuit of claim 8, wherein the injection locked oscillator comprises cross-coupled transistors that enable an oscillator function of the injection locked oscillator, wherein the cross-coupled transistors are turned on while the injection locked oscillator is turned on such that the oscillator function is enabled.

10. The injection locked oscillator circuit of claim 8, where the circuit includes a peak detector configured to detect the amplitude of the oscillator output signal for each value of the different values of the capacitance while the input signal having the target frequency is applied to the injection locking input, wherein the peak detector is directly coupled to the oscillator output for receiving the oscillator output signal.

11. A frequency multiplier, comprising:
a local oscillator (LO) configured to output a LO signal having a LO frequency;
a harmonic generator coupled to the local oscillator to receive the LO signal and configured to generate at an output thereof a generator output signal at a frequency which is a multiple of the LO frequency; and
an injection locked oscillator comprising:
an injection locked oscillator configured to receive an input signal having a target frequency at an injection locking input thereof, the injection locked oscillator comprising an LC tank having an adjustable capacitance, a control input configured to receive a control signal to adjust the capacitance of the LC tank, and an oscillator output configured to output an oscillator output signal; and
a circuit configured to calibrate the injection locked oscillator while the injection locked oscillator is turned on, wherein the circuit is configured to:
adjust a capacitance of the LC tank to different values while the injection locked oscillator is turned on,
while the injection locked oscillator is turned on, detect an amplitude of the oscillator output signal for each value of the different values of the capacitance while an input signal having a target frequency is applied to the injection locking input,
determine a maximum amplitude of the detected amplitudes, and
select a value for operating the injection locked oscillator based on the determined maximum amplitude,
wherein the circuit is coupled to the oscillator output and the control input of the injection locked oscillator, and is configured to apply a control signal corresponding to the selected value to the control input in a normal operation of the injection locked oscillator, and
wherein the injection locked oscillator is coupled to the harmonic generator to receive the generator output signal at the injection locking input thereof.

12. The frequency multiplier of claim 11, wherein the injection locked oscillator comprises cross-coupled transistors that enable an oscillator function of the injection locked oscillator, wherein the cross-coupled transistors are turned on while the injection locked oscillator is turned on such that the oscillator function is enabled.

13. The frequency multiplier of claim 11, where the circuit includes a peak detector configured to detect the amplitude of the oscillator output signal for each value of the different values of the capacitance while the input signal having the target frequency is applied to the injection locking input, wherein the peak detector is directly coupled to the oscillator output for receiving the oscillator output signal.

14. A frequency divider, comprising:
a local oscillator (LO) configured to output a LO signal having a LO frequency;
a divider circuit coupled to the local oscillator to receive the LO signal and configured to generate at an output thereof a divider circuit output signal at a frequency that is a fraction of the LO frequency;
an injection locked oscillator circuit comprising:
an injection locked oscillator configured to receive an input signal having a target frequency at an injection locking input thereof, the injection locked oscillator comprising an LC tank having an adjustable capacitance, a control input configured to receive a control signal to adjust the capacitance of the LC tank, and an oscillator output configured to output an oscillator output signal; and
a circuit configured to calibrate the injection locked oscillator while the injection locked oscillator is turned on, wherein the circuit is configured to:
adjust a capacitance of the LC tank to different values while the injection locked oscillator is turned on,
while the injection locked oscillator is turned on, detect an amplitude of the oscillator output signal for each value of the different values of the capacitance while an input signal having a target frequency is applied to the injection locking input,
determine a maximum amplitude of the detected amplitudes, and
select a value for operating the injection locked oscillator based on the determined maximum amplitude,
wherein the circuit is coupled to the oscillator output and the control input of the injection locked oscillator, and is configured to apply a control signal corresponding to the selected value to the control input in a normal operation of the injection locked oscillator, and
wherein the injection locked oscillator is coupled to the frequency divider to receive the frequency divider output signal at the injection locking input thereof.

15. The frequency divider of claim 14, wherein the injection locked oscillator comprises cross-coupled transistors that enable an oscillator function of the injection locked oscillator, wherein the cross-coupled transistors are turned on while the injection locked oscillator is turned on such that the oscillator function is enabled.

16. The frequency divider of claim 14, where the circuit includes a peak detector configured to detect the amplitude of the oscillator output signal for each value of the different values of the capacitance while the input signal having the target frequency is applied to the injection locking input, wherein the peak detector is directly coupled to the oscillator output for receiving the oscillator output signal.

17. An amplifier, comprising:
an injection locked oscillator circuit comprising:
an injection locked oscillator configured to receive an input signal having a target frequency at an injection locking input thereof, the injection locked oscillator comprising an LC tank having an adjustable capacitance, a control input configured to receive a control signal to adjust the capacitance of the LC tank, and an oscillator output configured to output an oscillator output signal; and
a circuit configured to calibrate the injection locked oscillator while the injection locked oscillator is turned on, wherein the circuit is configured to:
adjust a capacitance of the LC tank to different values while the injection locked oscillator is turned on,
while the injection locked oscillator is turned on, detect an amplitude of the oscillator output signal for each value of the different values of the capacitance while an input signal having a target frequency is applied to the injection locking input,
determine a maximum amplitude of the detected amplitudes, and
select a value for operating the injection locked oscillator based on the determined maximum amplitude, and
wherein the circuit is coupled to the oscillator output and the control input of the injection locked oscillator, and is configured to apply a control signal corresponding to the selected value to the control input in a normal operation of the injection locked oscillator.

18. The amplifier of claim 17, wherein the injection locked oscillator comprises cross-coupled transistors that enable an oscillator function of the injection locked oscillator, wherein the cross-coupled transistors are turned on while the injection locked oscillator is turned on such that the oscillator function is enabled.

19. The amplifier of claim 17, where the circuit includes a peak detector configured to detect the amplitude of the oscillator output signal for each value of the different values of the capacitance while the input signal having the target frequency is applied to the injection locking input, wherein the peak detector is directly coupled to the oscillator output for receiving the oscillator output signal.

20. A method of calibrating an injection locked oscillator comprising an LC tank, the method comprising:
applying an input signal having a target frequency to an injection locking input of the injection locked oscillator while the injection locked oscillator is turned on;
adjusting a capacitance of the LC tank to different values while the injection locked oscillator is turned on;
while the injection locked oscillator is turned on, detecting an amplitude of an output signal of the injection locked oscillator for each value of the different values of the capacitance while the input signal having the target frequency is applied to the injection locking input;
determining a maximum amplitude of the detected amplitudes; and
selecting a value for operating of the injection locked oscillator based on the determined maximum amplitude.

21. The method of claim 20, further comprising:
determining a value associated with the maximum amplitude; and
selecting the value associated with the maximum amplitude as the value for operating the injection locked oscillator.

22. The method of claim 20, wherein adjusting the capacitance of the LC tank comprises:
applying different digital control words to a capacitor bank of the LC tank to adjust the capacitance of the LC tank to the different values.

23. The method of claim 20, further comprising:
applying a local oscillator (LO) signal, having a LO frequency, to a harmonic generator to generate the input signal at the target frequency which is a multiple of the LO frequency.

24. The method of claim 20, further comprising:
applying a local oscillator (LO) signal, having a LO frequency, to a divider circuit to generate the input signal at the target frequency that is a fraction of the LO frequency.

25. The method of claim 20, wherein adjusting the capacitance of the LC tank comprises:
  adjusting the capacitance to the different values resulting in a resonance frequency of the LC tank in a frequency range of ±15% of the target frequency.

26. The method of claim 20, wherein the adjusting, detecting, determining, and selecting are performed when a circuit applying the input signal is powered up or after a predetermined operation time lapses.

27. The method of claim 20, wherein, while the injection locked oscillator is turned on, the injection locked oscillator is configured to oscillate via cross-coupled transistors being activated.

* * * * *